United States Patent [19]

Bogan et al.

[11] Patent Number: 4,662,967
[45] Date of Patent: May 5, 1987

[54] METHOD OF MAKING A GASKET FOR AN ELECTRONICS ENCLOSURE TO HELP KEEP OUT ELECTRICAL INTERFERENCE

[76] Inventors: John J. Bogan, 720 E.Sierra Madre Ave., Glendora, Calif. 91740; Robert E. Meeks, 2122 Royal Oaks Dr., Duarte, Calif. 91010

[21] Appl. No.: 631,483

[22] Filed: Sep. 10, 1984

Related U.S. Application Data

[62] Division of Ser. No. 455,662, Jan. 5, 1983, Pat. No. 4,575,578.

[51] Int. Cl.$^4$ .............................................. B29C 41/32
[52] U.S. Cl. .................... 156/242; 156/245; 174/35 R; 174/35 GC; 174/35 MS
[58] Field of Search ............. 156/242, 245; 174/35 R, 174/35 GC, 35 MS; 252/511, 512, 514

[56] References Cited

U.S. PATENT DOCUMENTS

| | | | |
|---|---|---|---|
| 3,140,342 | 7/1964 | Ehrreich et al. | 174/35 GC |
| 3,347,978 | 10/1967 | Simon et al. | 174/35 MS |
| 3,609,104 | 9/1971 | Ehrreich et al. | 174/35 GC |
| 4,011,360 | 3/1977 | Walsh | 174/35 GC |

FOREIGN PATENT DOCUMENTS

| | | | |
|---|---|---|---|
| 574032 | 4/1959 | Canada | 156/245 |
| 1900001 | 7/1970 | Fed. Rep. of Germany | 156/245 |

*Primary Examiner*—Caleb Weston
*Attorney, Agent, or Firm*—Romney Golant Martin Sheldon & Ashen

[57] ABSTRACT

A method of making a shielding gasket integral with a surface comprising the steps of (a) preparing a gasket material consisting of a mixture of an elastomer, a conductive filler, a catalyst and a bonding agent; (b) filling a mold with the gasket material; (c) covering the mold with a surface chosen to be bonded to the gasket; and (d) curing the gasket material in contact with the surface to utilize the bonding agent to bond the gasket material to the chosen surface. The article fabricated by this method comprises a gasket (18b), consisting of a mixture of an elastomer (26), a conductive filler (30) and a bonding agent (28), bonded to a surface (38) by the bonding agent during curing and having the particles comprising the conductive filler held in physical contact with the surface and with one another by the elastomer to which the particles are bonded.

8 Claims, 8 Drawing Figures

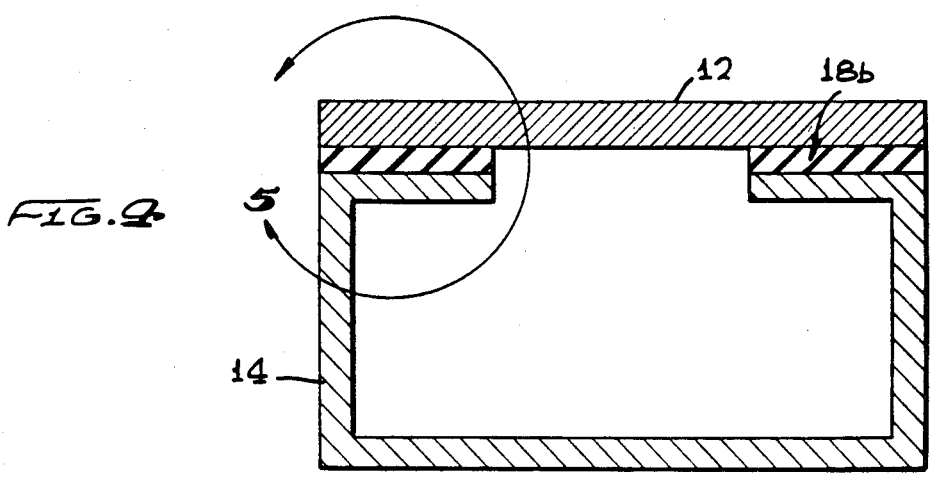
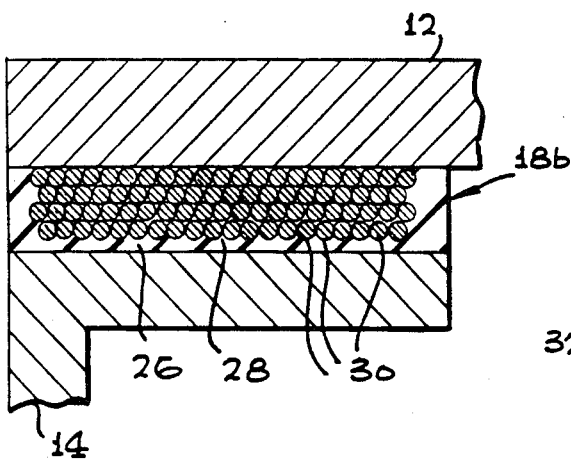
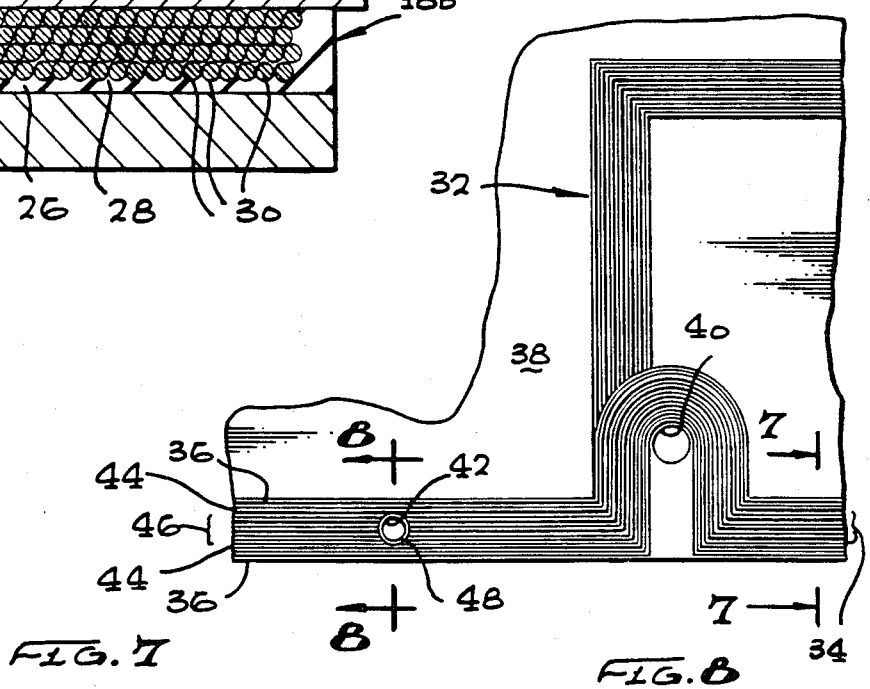
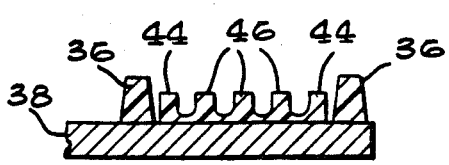
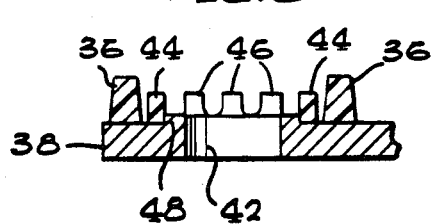

METHOD OF MAKING A GASKET FOR AN ELECTRONICS ENCLOSURE TO HELP KEEP OUT ELECTRICAL INTERFERENCE

RELATED APPLICATION

This is a divisional of copending application Ser. No. 455,662, filed Jan. 5, 1983, which issued Mar. 11, 1986, as U.S. Pat. No. 4,575,578.

TECHNICAL FIELD

The invention relates to the field of gaskets and, in particular, to a gasket integrally bonded to a surface during the molding and curing thereof.

BACKGROUND ART

Gaskets are commonly used to assist in the shielding of electrical components from electromagnetic radiation (EMR). This shielding is extremely important to eliminate cross-talk and spurious signals that would occur when electrical components are densely packed together or when the electrical components are subject to impinging EMR. In a typical case, the electrical components are placed in a metallic receptacle and a metallic cover which has a conductive gasket attached to it by an adhesive layer is fastened to the receptacle. The gasket is generally made conductive by the inclusion of metallic micro-particles in an elastomer during fabrication of the gasket.

These gaskets have, however, proved less than satisfactory for good EMR shielding and thermal conductivity. This was due basically to the fact that the adhesive used to bond the gasket to the cover is a poor electrical conductor, and a poor thermal conductor due to its erratic application, and thus the electromagnetic radiation is able to pass between the gasket and the cover and enter the receptacle, while heat transfer is impeded. In addition, in the case of metallic-coated glass microballoons, since the microballoons are free to move in the elastomer under vibration, the microballoons lose contact with one another and increase the resistivity of the gasket, thereby resulting in decreased resistance to EMR. Furthermore, the use of adhesives causes uncontrolled variations in gasket conductance and height, due to the inability to apply them in a perfectly uniform thickness. This results in improper closure both where the gasket height is too low and where the gasket height is too high due to insufficient local closure force to properly deflect the gasket. Moreover, since the gaskets are generally cut after curing to fit a particular cover shape or contour, the micro-particles are exposed to air and proceed to corrode, resulting in a general degradation of the properties of the gasket. Such gaskets also degrade in their electrical properties due to handling, stretching and elongation, due to the failure of the adhesives over time, and due to handling, shelf-life and pot-life (during application) adhesive complications. Typical gaskets, their method of manufacture, and the manufacture of the metallic micro-particles are described in U.S. Pat. Nos. 3,140,342, 3,194,860, and 3,202,488, respectively. Finally, existing gaskets cannot be used as shields against ultrahigh frequencies (>20 GHZ) and for micro-integrated circuits where complicated gasket designs and tight tolerances are essential.

Accordingly, it is a general object of the present invention to provide an improved shielding gasket for use against electromagnetic radiation.

It is another object of the present invention to provide a shielding gasket that is integrally bonded to a surface for use against electromagnetic radiation and which also provides good thermal conductivity.

It is a further object of the present invention to provide an improved method of making a shielding gasket-surface combination that effectively shields against electromagnetic radiation, while providing effective thermal conductivity.

It is still another object of the present invention to provide a shielding gasket whose resistivity is stable under conditions of vibration.

It is still a further object of the present invention to provide a shielding gasket which will not degrade in its properties during application and use.

DISCLOSURE OF INVENTION

A method of making a shielding gasket integral with a surface for use against electromagnetic radiation and which also provides good thermal conductivity is provided. The method comprises the steps of (a) preparing a gasket material consisting of a mixture of an elastomer, a conductive filler, a catalyst and a bonding agent; (b) filling a mold with the gasket material; (c) covering the mold with a surface chosen to be bonded to the gasket; and (d) curing the gasket material in contact with the surface to utilize the bonding agent to bond the gasket material to the chosen surface. The article fabricated by this method comprises a gasket, consisting of a mixture of an elastomer, a conductive filler and a bonding agent, bonded to a surface by the bonding agent during curing and having the particles comprising the conductive filler held in physical contact with the surface and with one another by the elastomer to which the particles are bonded.

The novel features which are believed to be characteristic of the invention, both as to the method and the article fabricated thereby, together with further objects and advantages thereof, will be better understood from the following description in connection with the accompanying drawings in which a presently preferred embodiment of the invention is illustrated by way of example. It is to be expressly understood, however, that the drawings are for purposes of illustration and description only and are not intended as a definition of the limits of the invention.

BRIEF DESCRIPTION OF THE DRAWINGS

FIG. 4 is a cross-sectional view of the shielding box of FIG. 1 taken along line 4—4 of FIG. 1 illustrating the gasket of the present invention.

FIG. 5 is a detailed view of the region 5—5 of FIG. 4.

FIG. 6 is a plan view of a second embodiment of the present invention.

FIG. 7 is a cross-sectional view of the embodiment of FIG. 6 taken along line 7—7 of FIG. 6.

FIG. 8 is a cross-sectional view of the embodiment of FIG. 6 taken along line 8—8 of FIG. 6.

BEST MODE FOR CARRYING OUT THE INVENTION

Figure 1:
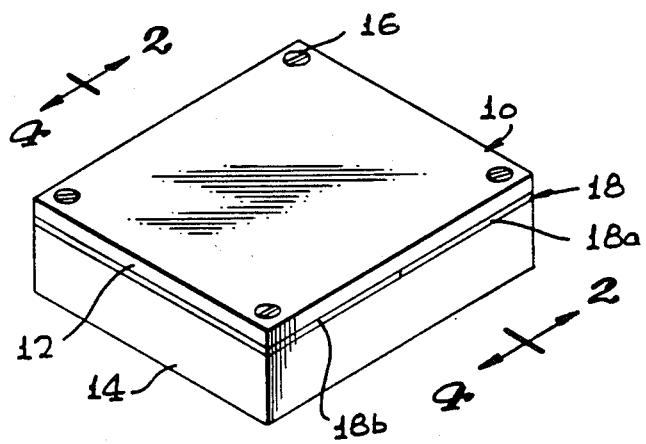
FIG. 1 is a perspective view of a metallic shielding box.

Referring now to FIG. 1, a perspective view of a metallic shielding box is illustrated. The box 10 comprises a metal cover 12 fastened to a metal receptacle 14 by means of screws 16. Between the cover 12 and the receptacle 14 is a conductive gasket 18 which acts to prevent electromagnetic radiation from entering the box 10 between the cover 12 and the receptacle 14. For purposes of descriptive contrast, the gasket 18 is shown to consist of two gasket portions, 18a and 18b, gasket portion 18a beign of prior art construction and gasket portion 18b being constructed according to the present invention.

Figure 2:
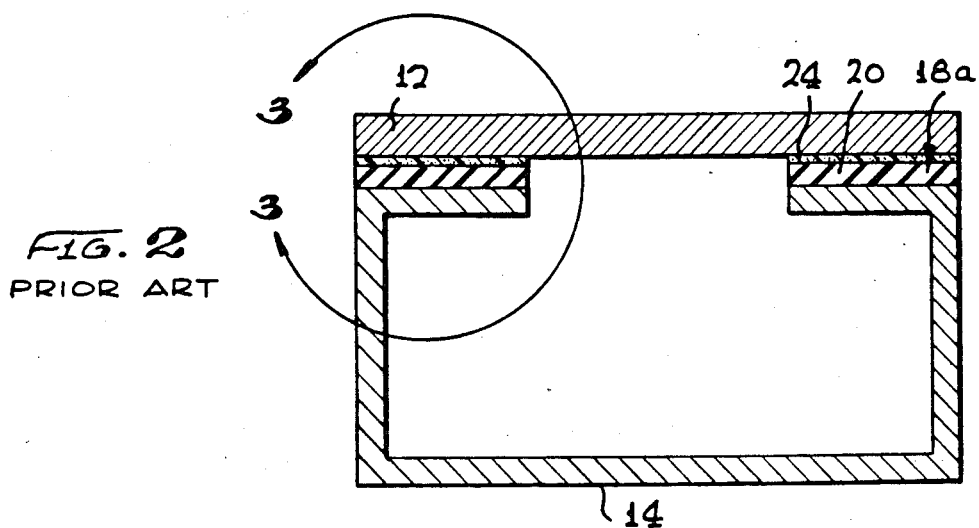
FIG. 2 is a cross-sectional view of the shielding box of FIG. 1 taken along line 2—2 of FIG. 1 illustrating a prior art gasket.
Figure 3:
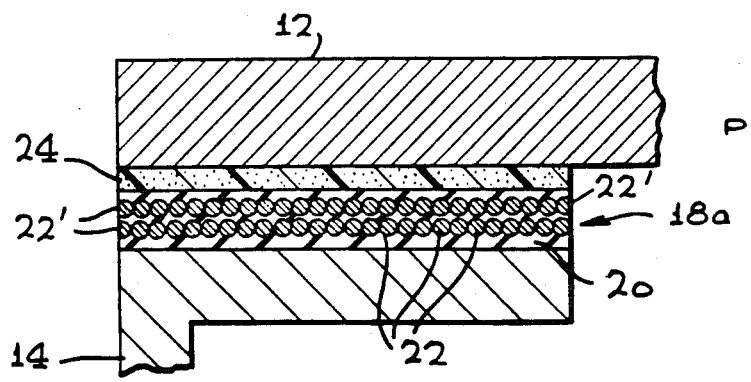
FIG. 3 is a detailed view of the region 3—3 of FIG. 2.

In FIGS. 2 and 3, the prior art gasket portion 18a is illustrated. The gasket portion 18a consists of an elastomer 20 in which a conductive filler 22, such as a plurality of metallic micro-particles, is embedded. The filler 22 is mixed with the elastomer 20 when the elastomer 20 is in an uncured flowable state and becomes part of the structure of the gasket portion 18a when it is cured to cause the gasket portion 18a to become conductive. The gasket portion 18a can initially exist as part of a larger sheet of material which is then cut to a particular shape or contour, or it can be extruded or molded. In the general case where the gasket portion 18a is cut, a certain portion of the filler 22 is exposed during the cutting process, as shown in FIG. 3, which filler portion 22' is then susceptible to corrosion from exposure to air and moisture and proceeds to cause degradation of the entire gasket due to internal spread of such corrosion. The gasket portion 18a has a layer of adhesive 24 applied to the elastomer 20 which serves to bond the gasket portion 18a to the cover 12. For the reasons stated above, the adhesive 24 is a poor conductor and thus allows a portion of the impinging electromagnetic radiation to enter the box 10 between the cover 12 and the elastomer 20. Since the filler 22 is poorly bonded to the elastomer 20, in the case where the filler 22 consists of metallic-coated glass microballoons, the microballoons are free to move under vibration and thus lose contact with one another, causing the gasket portion 18a to become less conductive and to more freely transmit electromagnetic radiation. Furthermore, general handling of the separate gasket portion 18a and adhesive application of it to the cover 12 causes elongation and loss of intimate contact of the filler 22, causing it to become less conductive and to more freely transmit electromagnetic radiation.

Referring now to FIGS. 4 and 5, the gasket portion 18b consists of a mixture of elastomer 26, bonding agent 28 and filler 30. As more fully described hereinafter, the elastomer 26, the bonding agent 28 and the filler 30 are mixed with a catalyst when the elastomer 26 is in an uncured flowable state and the uncured mixture is placed in a mold which is sealed with the cover 12. Pressure and heat are then applied to cure the mixture. The result is a gasket portion 18b in which the bonding agent 28 bonds the elastomer 26 into integral contact with the cover 12, and since the bonding agent 28 also bonds the elastomer 26 to the particles of the filler 30, the filler 30 is held in physical contact with the surface of the cover 12 by the elastomer 26. In addition, the particles comprising the filler 30 are bonded into place within the elastomer 26, are held in physical contact with one another by the elastomer 26, and thus do not move under vibratory forces. Also, since the gasket portion 18b is molded to a particular shape or contour and is not cut, none of the filler 30 is exposed to moisture or air. Finally, since the gasket is cured and bonded in place, none of the EMR shielding or thermal characteristics are degraded due to handling, stretching, elongation and cutting of the gasket, and poor and uneven adhesive application and general adhesive failure. It has been found, moreover, in pull tests that the gasket of the present invention fails internally before the gasket-cover interface fails. Thus good thermal conductivity is obtained because of the intimate filler-filler-cover contacts, none of the impinging electromagnetic radiation can leak between the cover 12 and the elastomer 26, as in the prior art devices, and the volume resistivity of the gasket portion 18b, generally of the order of 0.004 to 10 ohm cm., remains at a low fixed value under the action of vibratory forces due to the bonding of the filler 30 to the elastomer 26.

The gasket portion 18b is made in accordance with the method of the present invention by mixing 60% by volume of an elastomer, such as a 10 durometer silicone rubber, with 40% by volume of a conductive filler, such as silver-coated copper micro-particles having a diameter less than 6 microns. The particular percentages of the elastomer and the filler and the diameter of the filler will, however, vary depending upon the type of filler being used and the desired resistivity of the gasket. Other fillers could include silver and copper powder particles or spheres, silver-coated glass particles or spheres, aluminum powder, particles or spheres, tungsten powder, particles or spheres, nickel powder, particles or spheres, iron powder, particles or spheres, aluminum powder, particles or spheres, metallized coated ceramic powder, particles or spheres and conductive carbon particles. Mixtures of the foregoing may also be used. The type of filler used is based upon environment, electrical needs and mechanical configurations. Next, a bonding agent, 0.5-2.0%, typically 1%, by weight of the elastomer, is milled into the above mixture when the filler is added. A bonding agent which may be used in the process can be triallylcynanurate or can be chosen from the class of silicate esters. It should be noted that whereas in the prior art mixtures the bonding agent is placed on the metal surface to which the gasket is to be bonded, the raw uncured elastomer in the present invention contains the bonding agent and allows bonding of the elastomer to take place to both the filler and the surface to be bonded to. Finally, a catalyst, 0.5-5.0%, typically 1%, by weight of the elastomer, is added to the mixture. The catalysts used in the process may be of a peroxide base, such as dicumyl peroxide; or the commercially available material known by the trade name "Varox", which is 2,5-dimethyl-2,5-bis (t-butyl-peroxy)hexane and is made by the R. T. Vanderbilt Company; or the commercially available material known by the trade name "BSG", which is benzoyl peroxide and is made by Thalco; such catalysts operate in a temperature range about 360°, 310° F., and 235° F., respectively, The catalyst is chosen so as to be compatible with materials used in conjunction with the cover 12, such as paints, metal finishes, plastics, etc. Other catalysts, such as platinum based catalysts, can be used where reversion of the elastomer, both mechanical and chemical, is of prime concern.

The mixture is then calendered to a selected thickness, cut into strips and inserted into a mold having a reverse-image slot machined therein of the desired gasket configuration. The mating surface, such as a metallic cover, is placed on the mold. The surface can be selected from a variety of metals and can be treated with various finishes, such as chem film, electrolysis nickel, or tin or silver plated, etc. A press then applies a pressure of 300 PSIG for 15 minutes at 310° F. to cure, configure and hot vulcanize the mixture in contact with the mating surface. The mold is then removed from the press, left to cool to room temperature, and the flash trimmed away. The temperature chosen may range from 360° F.–240° F. depending upon the particular catalyst used. The time will also vary depending upon the thickness of the gasket being cured, with 15 minutes being suitable for a gasket 0.08" in thickness.

Using the above method, a multiribbed gasket can be fabricated which has been found to be extremely effective against electromagnetic radiation and which, if desired, can be combined with an environmental seal, as described below. As shown in FIGS. 6, 7 and 8 the gasket 32 has a plurality of ribs 34, 36 which are bonded to a metallic mating surface 38 using the above-described method. The ribs 34 are first formed in accordance with the above-described method using a multiribbed mold similar to the single-slot mold used in the above-described method but having a selected number of grooves, generally parallel, machined therein for formation of the ribs 34. The ribs 34 generally range from 2–7 in number and are, for example, from 0.022" to 0.050" in depth depending on the use of the gasket, with the gasket ranging from 0.032" to 0.060" inches in thickness in consonance with the depth of the ribs. The ribs 34 are 0.035" thick with an 0.035" spacing between them and the width of the ribs 34 ranges from 0.251" to 0.601" depending upon the number of the ribs 34. It can readily be seen that since the rib dimensions and configurations are solely a function of the tooling, rib dimensions and configurations can now be obtained that were heretofore desirable but impossible.

A mixture of elasomer, bonding agent and catalyst, similar to that used for the ribs 34 but excluding the filler, is then used for the fabrication of the ribs 36 which comprise the environmental seal. The elastomer may consist of a 20–30 durometer fluorosilicone rubber. The multiribbed mold used for the ribs 34 also contains the grooves for the ribs 36, which grooves are generally parallel to the ribs 34. After the ribs 34 have been fabricated, the grooves for the ribs 36 are then filled with the above-recited mixture, the surface 38 with the ribs 34 thereon is placed again on the mold and heat and pressure are applied to cure, configure and hot vulcanize the ribs 36 to the surface 38. The ribs 36 range in depth from 0.052" to 0.083", are typically 0.063" in width and are spaced 0.010" from the ribs 34. Since the tooling can be configured so that both the environmental seal and the shielding gasket can be configured, cured and bonded at the same time, the ribs 36 can also be fabricated concurrently with the ribs 34 if the processing times, temperatures and pressures are compatible for the two mixtures. If there are any holes in the surface 38, such as hole 40, the ribs 34, 36 can be configured to curve around the holes. If the holes are small enough, such as hole 42, the outer ribs 44 of the ribs 34 are made to pass on either side of the outside of the hole 42, while the inner ribs 46 of the ribs 34 are made to terminate on either side of the centers of the hole 42. A compression washer or standoff 48 is formed around the hole 42 during the fabrication of the surface 38, which washer 48 is integral with and of the same material as the surface 38 and prevents compression of the ribs 34, 36. In order to form this configuration, the surface can be machined to form compression washers around the holes in the surface, and the mold can be machined to have parallel grooves corresponding to the ribs, some of which would terminate at the compression washers and others of which would pass by the outer edges of the compression washers.

A novel method of making a radiation shielding and thermally conductive gasket integral with a surface has thus been described which permits the manufacture of shielding gaskets in dimensions and configurations and for applications heretofore deemed impossible, and which can vastly improve gasket EMR shielding and thermal conductivity in current applications. With this in mind, it is obvious that numerous modifications and departures may be made to the present invention by those skilled in the art; thus the invention is to be construed as being limited only by the spirit and scope of the appended claims.

INDUSTRIAL APPLICABILITY

The radiation shielding and thermally conductive gasket integral with a surface, and the method of fabrication thereof, is useful for shielding against electromagnetic radiation, provides good thermal conductivity and, in conjunction with an environmental seal, affords environmental protection.

What is claimed is:

1. The method of making a shielding gasket integral with a surface comprising the steps of:
    (a) preparing a gasket material consisting of a mixture of an elastomer, a conductive filler, a catalyst and a bonding agent;
    (b) filling a mold with said gasket material;
    (c) covering said mold with a surface chosen to be bonded to said gasket material; and
    (d) curing said gasket material in contact with said surface to utilize said bonding agent to bond said gasket material to said surface;
    said mold having at least one groove therein to receive said gasket material and at least one groove to receive a mixture of an elastomer, a catalyst and a bonding agent adapted to form an environmental gasket bonded to said surface upon being cured.

2. The method of claim 1 wherein said environmental gasket is cured simultaneously with said shielding gasket.

3. The method of claim 1 wherein said environmental gasket is cured subsequent to said shielding gasket.

4. A method of making a compressible shielding gasket integral with a mating surface, for repetitive use and reuse in compression contact between said surface and another closure surface; in the finished gasket there being an electrically conductive filler dispersed throughout an elastomeric matrix, the filler being fixedly bonded in place to the elastomer; said method comprising the steps of:
    (a) preparing a mold as the reverse shape of a gasket;
    (b) preparing an elastomer of relatively high compressibility;
    (c) adding to the elastomer a catalyst;
    (d) adding to the elastomer a conductive filler to impart electrical conductivity to the elastomer;
    (e) adding to the elastomer a bonding agent;
    (f) mixing the elastomer, catalyst, conductive filler and bonding agent to form a gasket material throughout which the elastomer and the bonding agent are in initmate contact with the filler and with one another;

(g) then filling the mold with said gasket material;

(h) covering the mold with such a mating surface chosen to be bonded to said gasket material so that one side only of the material contacts the surface; and (i) then simultaneously:
  (1) bonding, by virtue of the bonding agent, the elastomer to the conductive filler throughout the material,
  (2) bonding, by virtue of the bonding agent, the elastomer to the surface where the material is in contact with the surface to form a unitary gasket-and-surface combination, at one side only of the material, that is repetitively reusable in a compression contact between the surface and such other closure surface, and
  (3) curing the elastomer to form a free surface of the gasket material where the material is in contact with the mold to provide a gasket that is repetitively reusable in a compression joint.

5. The method of claim 4:

wherein the elastomer-to-filler bonding step (i)(1) imparts vibration resistance but also tends to decrease compressibility of the finished gasket; and also comprising the step of: (j) selecting for use as the elastomer in step (a) an elastomer of low durometer on the order of ten;

wherein the selecting step (j) counteracts the tendencies of the filler-adding step (d) and of the elastomer-and-filler-bonding step (i)(1) to decrease compressibility, and causes the gasket to be adequately compressible for use in such a compression joint.

6. The method of claim 4 wherein:

the elastomer-to-filler bonding step (i)(1) imparts vibration resistance but also tends to decrease compressibility of the finished gasket; and said mold is the reverse shape of a gasket with a plurality of ribs;

whereby the method produces a gasket that has a plurality of ribs to enhance the overall compressibility of the gasket.

7. The method of claim 4 wherein:

steps (b) and (d) comprise adding approximately sixty percent by volume of the elastomer approximately forty percent by volume of the conductive filler;

step (c) comprises adding a quantity of a catalyst between one-half percent and five percent by weight of the elastomer;

step (e) comprises adding a quantity of a bonding agent between one-half percent and two percent by weight of said elastomer; and step (f) comprises heating the gasket material to an elevated curing temperature, and maintaining said gasket material at that temperature while applying an elevated curing pressure.

8. The method of claim 7 wherein:

said mold is the reverse shape of a gasket with a plurality of ribs;

whereby the method produces a gasket that has a plurality of ribs to enhance the overall compressibility of the gasket.

* * * * *